(12) United States Patent
Shiobara et al.

(10) Patent No.: US 8,198,005 B2
(45) Date of Patent: Jun. 12, 2012

(54) METHOD OF FORMING RESIST PATTERN

(75) Inventors: Eishi Shiobara, Yokohama (JP);
Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 610 days.

(21) Appl. No.: 12/404,917

(22) Filed: Mar. 16, 2009

(65) Prior Publication Data
US 2009/0305174 A1 Dec. 10, 2009

(30) Foreign Application Priority Data
Jun. 5, 2008 (JP) .................. 2008-147957

(51) Int. Cl.
*G03F 7/00* (2006.01)
*G03F 7/20* (2006.01)
*G03B 27/52* (2006.01)
(52) U.S. Cl. ............ 430/270.1; 430/311; 430/322; 430/300; 430/331; 355/30; 355/55
(58) Field of Classification Search .......... 430/270.1, 430/322, 311, 330, 331; 355/30, 53
See application file for complete search history.

(56) References Cited

U.S. PATENT DOCUMENTS

| | | | |
|---|---|---|---|
| 3,892,000 A | 7/1975 | Morse | |
| 6,227,546 B1 | 5/2001 | Halling | |
| 6,903,799 B2 * | 6/2005 | Tsuji et al. | 355/30 |
| 7,090,963 B2 * | 8/2006 | Medeiros et al. | 430/311 |
| 7,119,952 B2 * | 10/2006 | Yamamoto | 359/358 |
| 7,193,682 B2 | 3/2007 | Yonekawa | |

(Continued)

FOREIGN PATENT DOCUMENTS
JP  2003-234282  8/2003

OTHER PUBLICATIONS

Hinsberg, W. et al., "Effect of Resist Components on Image Spreading During Postexposure Bake of Chemically Amplified Resists," In Advances in Resist Technology and Processing XVII, Francis M. Houlihan Editor, Processing of SPIE vol. 3999, pp. 148-170, (2000).

(Continued)

*Primary Examiner* — Amanda C. Walke
(74) *Attorney, Agent, or Firm* — Finnegan, Henderson, Farabow, Garrett & Dunner, L.L.P.

(57) ABSTRACT

Provided is a method of forming a resist pattern capable of forming a resist pattern, whose dimensional variations and defects are reduced as far as possible, with a high throughput. The invention provides a method of forming a resist pattern involving the following: forming a resist film on a substrate; subjecting the resist film to exposure treatment in a pressure-reduced condition after performing pressure-reducing treatment; performing reduced-pressure releasing treatment that releases the resist film from a pressure-reduced condition while humidifying the resist film by introducing a humidity-adjusted gas into the pressure-reduced environment; performing bake treatment that heats the resist film after the reduced-pressure releasing treatment; and developing the resist film.

18 Claims, 9 Drawing Sheets

U.S. PATENT DOCUMENTS

| | | | |
|---|---|---|---|
| 7,300,741 B2 * | 11/2007 | Huang et al. | 430/270.1 |
| 7,423,724 B2 * | 9/2008 | Hasegawa et al. | 355/53 |
| 7,670,754 B2 * | 3/2010 | Edo et al. | 430/311 |
| 7,989,354 B2 * | 8/2011 | Nakajima et al. | 438/725 |
| 2004/0222383 A1 | 11/2004 | Kawakami | |
| 2005/0121144 A1 * | 6/2005 | Edo et al. | 156/345.32 |
| 2006/0215137 A1 * | 9/2006 | Hasegawa et al. | 355/53 |
| 2007/0065734 A1 * | 3/2007 | Inao et al. | 430/5 |
| 2007/0273850 A1 * | 11/2007 | Brewster | 355/30 |
| 2008/0073571 A1 * | 3/2008 | Imoto et al. | 250/492.1 |
| 2010/0183987 A1 * | 7/2010 | Yonekawa | 430/325 |

OTHER PUBLICATIONS

Houle, F. A. et al., "Determination of Coupled Acid Catalysis-Diffusion Processes in a Positive-Tone Chemically Amplified Photoresist," J. Vac. Sci. Technolo., B 18, No. 4, pp. 1874-1885, (Jul./Aug. 2000).

Matsunaga, K. et al., "Method for Treating Substrate, Method for Conveying Substrate, and Apparatus for Conveying Substrate," U.S. Appl. No. 12/261,596, filed Oct. 30, 2008.

Miyoshi, S. et al., "Patterning Method," U.S. Appl. No. 12/256,240, filed Oct. 22, 2008.

* cited by examiner

METHOD OF FORMING RESIST PATTERN

CROSS REFERENCE TO RELATED APPLICATION

This application is based upon and claims the benefit of priority from prior Japanese Patent Application No. 2008-147957, filed on Jun. 5, 2008, the entire contents of which are incorporated herein by reference.

BACKGROUND OF THE INVENTION

1. Field of the Invention

The present invention relates to a method of forming a resist pattern and, more particularly, to a method of forming a resist pattern, for example, by electron beam exposure or EUV exposure.

2. Background Art

In recent years, next-generation lithography technology based on the use of soft X-rays (extreme ultraviolet rays: EUV), electron beams (EB) and the like as the exposure source has been actively studied and developed in order to realize further miniaturization in the semiconductor process. In consideration of the intensity of the exposure source and throughput, it is desirable that resists used in this next-generation lithography have high sensitivity. There is a chemical amplification resist (CAR) as one of such resist materials. When exposure light is radiated on a chemical amplification resist, an acid is generated in the resist. After that, bake treatment is performed, whereby an acid-catalysis reaction occurs using this acid as a catalyst and the solubility of the resist for a developer changes. A desired pattern can be obtained by utilizing this phenomenon. Even when the amount of the acid generated by exposure is small, a very high sensitivity is obtained because the reaction proceeds in a chain-like manner due to diffusion during the heat treatment.

In fabricating a fine pattern by using this chemical amplification resist, it is important to control the diffusion distance of an acid generated by exposure. This is because resolution deteriorates if the diffusion distance of an acid is too long, and sensitivity decreases if this distance is too short.

The occurrence of an image quality degradation (a deviation of a developed pattern image from an irradiated pattern image) is considered as one of the problems occurring when a chemical amplification resist is used. It is said that acid diffusion exists as a first factor contributing to this image quality degradation (Hinsberg et al., Proc. SPIE, 2000, 3999, 148). An acid generated from a photoacid generator (PAG) contained in a resist and the mobility within a polymer matrix have an effect on this factor. This mobility within the polymer matrix is influenced by the chemical functionality contained in the polymer, the free volume of the matrix, the glass transition temperature (Tg) of the polymer, and the temperature and time of bake treatment performed after exposure.

It is explained that a second factor contributing to an image quality degradation is reactive propagation (Hinsberg et al., Proc. SPIE, 2000, 3999, 148; Houle et al., J. Vac. Sci. Technol. B, 2000, 18, 1874). This reactive propagation can be best explained by an Arhenius behavior. It is said that activation energy (enthalpy), the volatility of products (entropy), and the availability and concentration of deprotection-reaction-dependent co-reactants, such as moisture, determine the degree to which the reaction propagates in a manner departing from an original acid profile.

Furthermore, it has been recognized that an image quality degradation has temperature dependence. Breyta et al. have disclosed that appropriate baking conditions can optimize the resolution capable of being realized with a chemical amplification resist (U.S. Pat. No. 6,227,546).

Incidentally, because the above-described acid-catalysis reaction is a kind of hydrolysis, the reaction proceeds readily in the presence of moisture. However, in electron beam exposure (EB exposure) and EUV exposure, the exposure is performed in a vacuum (on the order of $10^{-6}$ Pa) in order to prevent exposure light from being absorbed by molecules in the air. For this reason, the moisture in a resist film is removed during the exposure process and an acid-catalysis reaction in the bake process after exposure becomes insufficient. This has caused the problem that sensitivity decreases greatly. David R. Medeiros, IBM, et al. disclosed means of performing the post-exposure bake treatment of an acetal-based chemical amplification resist in a humid atmosphere with relative humidities of 10% to 80% (U.S. Pat. No. 3,892,000). However, it was difficult to obtain a resist pattern of required quality.

Furthermore, it is required that the throughput of a resist pattern forming process using next-generation lithography technology be improved. Because in EUV exposure, the exposure is performed in a vacuum, it is necessary to perform vacuuming (the pressure reducing step) in a front chamber of an exposing machine. On that occasion, the gas in the front chamber expands adiabatically, whereby the temperature of the gas decreases and the temperature of the substrate decreases accordingly. If the substrate temperature deviates from a prescribed temperature, positioning shifts and focal shifts occur during exposure due to the thermal shrinkage and expansion of the substrate. Therefore, it is necessary that the substrate temperature during exposure be strictly controlled. For this reason, it is conceivable to return the temperature to a prescribed temperature by heating the substrate or to reduce the rate of vacuuming. There has hitherto been disclosed an exposing device in which heating means is provided in a load lock chamber to cope with a decrease in the substrate temperature during vacuuming (Japanese Patent Laid-Open No. 2003-234282). However, when such a device is used, the heating step is added to a conventional process and, therefore, this posed the problem that the throughput decreases. In particular, in the case of EUV exposure, whose exposure time is exceedingly short compared to EB exposure, the throughput decreases substantially even if time other than the exposure time increases even only a little.

SUMMARY OF THE INVENTION

In an aspect of the present invention, a method of forming a resist pattern involving the following is provided: forming a resist film on a substrate; subjecting the resist film to exposure treatment in a pressure-reduced condition after performing pressure-reducing treatment; performing reduced-pressure releasing treatment that releases the resist film from a pressure-reduced condition while humidifying the resist film by introducing a humidity-adjusted gas into the pressure-reduced environment; performing bake treatment that heats the resist film after the reduced-pressure releasing treatment; and developing the resist film.

DESCRIPTION OF THE EMBODIMENTS

Before the description of embodiments of the present invention, a description will be given of how the present inventors have reached the present invention.

In order to form a high-quality resist pattern with a high throughput by using next-generation lithography technology, the present inventors have conducted investigations. As described above, there was a conventional method that involves humidification during post-exposure bake treatment in order to recover the resist sensitivity that has decreased because of the lost of moisture in a resist film due to exposure in a vacuum. However, because the bake temperature is relatively low (15° C. to 60° C.), a sufficient resist sensitivity was incapable of being obtained. Furthermore, the present inventors carried out experiments in a unique manner and as a result obtained the knowledge that with this method, moisture is not taken into the resist plane because humidification is performed at the same time with bake treatment and variations in the reaction rate occur in the plane, with the result that dimensional variations (an in-plane dimensional difference) of a resist pattern after development may increase. In such a case, if dimensional variations occur locally due to this in-plane dimensional difference, pattern collapses and short-circuit defects occur and it is impossible to obtain a resist pattern of desired quality.

Three embodiments related to the present invention will be described below with reference to the drawings.

The first embodiment and the second embodiment have a common point in that humidification is performed before post-exposure bake treatment. One of the differences is the kind of a resist to be used. That is, a chemical amplification resist is used in the first embodiment, whereas a non-chemical amplification resist is used in the second embodiment. One of the features of the third embodiment is to perform the adjustment of the substrate temperature before a substrate is carried into an exposing device.

First Embodiment

Figure 1:
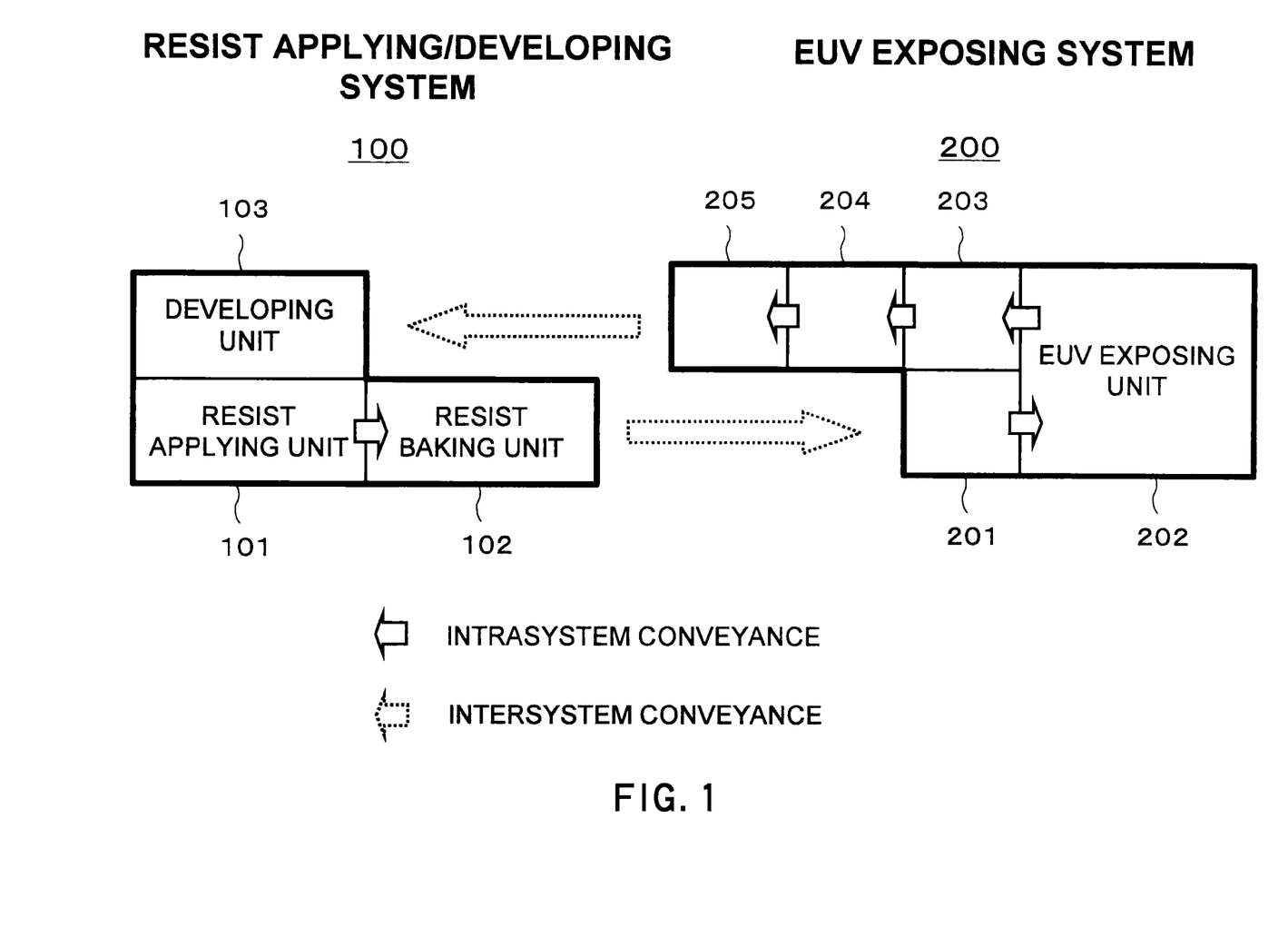
FIG. 1 is a diagram showing the schematic configurations of a resist applying/developing system and an EUV exposing system.

A description will be given of a method of forming a resist pattern related to the first embodiment. FIG. 1 shows the schematic configurations of a resist applying/developing system 100 and an EUV exposing system 200, which are used in resist pattern formation. As is apparent from this figure, the resist applying/developing system 100 is provided with a resist applying unit 101, a resist baking unit 102, and a developing unit 103. The EUV exposing system 200 is provided with a first chamber 201 (a front chamber of an exposing machine), an EUV exposing unit 202 (an exposure chamber), a second chamber 203, a third chamber 204, and a post-exposure baker 205. The arrows in the figure indicate the flow of a substrate that is conveyed.

Figure 2:
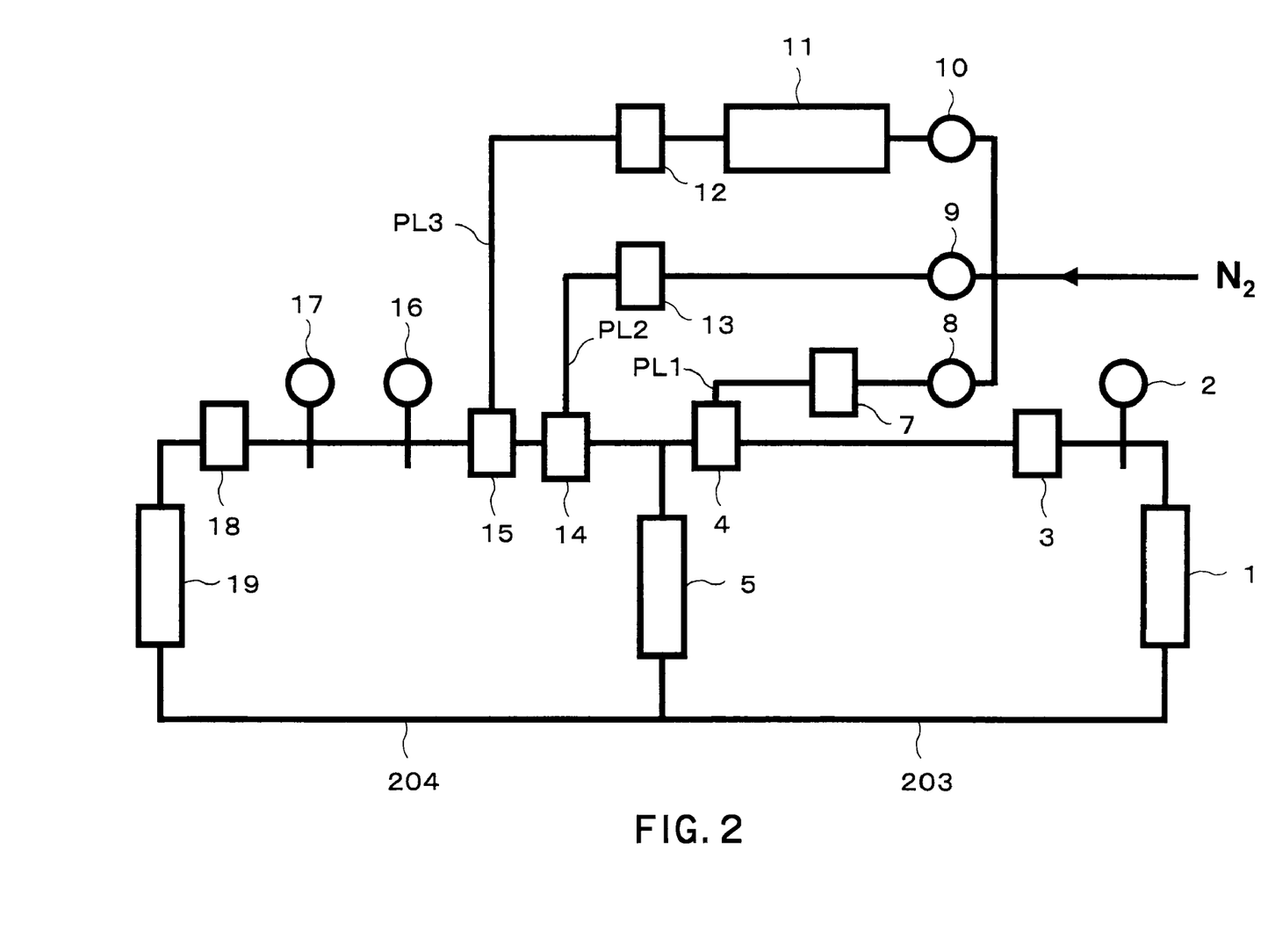
FIG. 2 is a diagram showing the configuration of a second chamber and a third chamber.

Next, the configuration of the second chamber 203 and third chamber 204 of the EUV exposing system 200 will be described. FIG. 2 shows the configuration of the second chamber 203 and the third chamber 204.

As is apparent from FIGS. 1 and 2, each chamber is partitioned by gate valves. That is, a gate valve 1 is provided between the EUV exposing unit 202 and the second chamber 203. A gate valve 5 is provided between the second chamber 203 and the third chamber 204. A gate valve 19 is provided between the third chamber 204 and the post-exposure baker 205.

The second chamber 203 is provided with a vacuum gauge 2, a vacuuming port 3 and a purging port 4. As is apparent from FIG. 2, nitrogen gas ($N_2$) can be introduced into the second chamber 203 through a purging line PL1. This purging line PL1 has an on-off valve 8 and a mass flow controller 7, and introduces nitrogen gas not containing humidity (nitrogen gas of 0% humidity) into the second chamber 203 from the purging port 4 by controlling the flow rate of this gas. The mass flow controller 7 controls the volume of nitrogen gas introduced into the second chamber 203 and has the function of operating by feeding back measured values of the vacuum gauge 2.

The third chamber 204 is provided with two purging ports 14, 15, a hygrometer 16, a vacuum gauge 17, and a vacuuming port 18. As is apparent from FIG. 2, nitrogen gas ($N_2$) can be introduced into the third chamber 204 via purging lines PL2 and PL3. An inner surface of the third chamber 204 is made ultra-water-repellent so that dew condensation does not occur.

The purging line PL2 has an on-off valve 9 and a mass flow controller 13, and introduces nitrogen gas not containing humidity into the third chamber 204 from the purging port 14 by controlling the flow rate of this gas. The mass flow controller 13 controls the volume of nitrogen gas introduced into the third chamber 204 and has the function of operating by feeding back measured values of the vacuum gauge 17.

The purging line PL3 has an on-off valve 10, a humidity controller 11, and a mass flow controller 12, and can introduce humidity-controlled nitrogen gas into the third chamber 204. The mass flow controller 12 controls the volume of nitrogen gas introduced into the third chamber 204 and has the function of operating by feeding back measured values of the vacuum gauge 17. The humidity controller 11 adjusts the humidity of nitrogen gas introduced from the purging port 15 and has the function of operating by feeding back measured values of the humidity in the third chamber 204 measured by the hygrometer 16. The humidity and flow rate of nitrogen gas introduced from the purging port 15 are controlled by such means. Incidentally, the purge rate becomes irregular when the humidity control and flow rate control of nitrogen gas are performed. To compensate for this irregularity, the mass flow controller 13 makes a fine adjustment of the volume of nitrogen gas introduced from the purging port 14.

As described above, the flow rates of nitrogen gas introduced from the purging port 14 and the purging port 15 are each controlled. As a result of this, the pressure and relative humidity in the third chamber 204 can be controlled.

Figure 3:
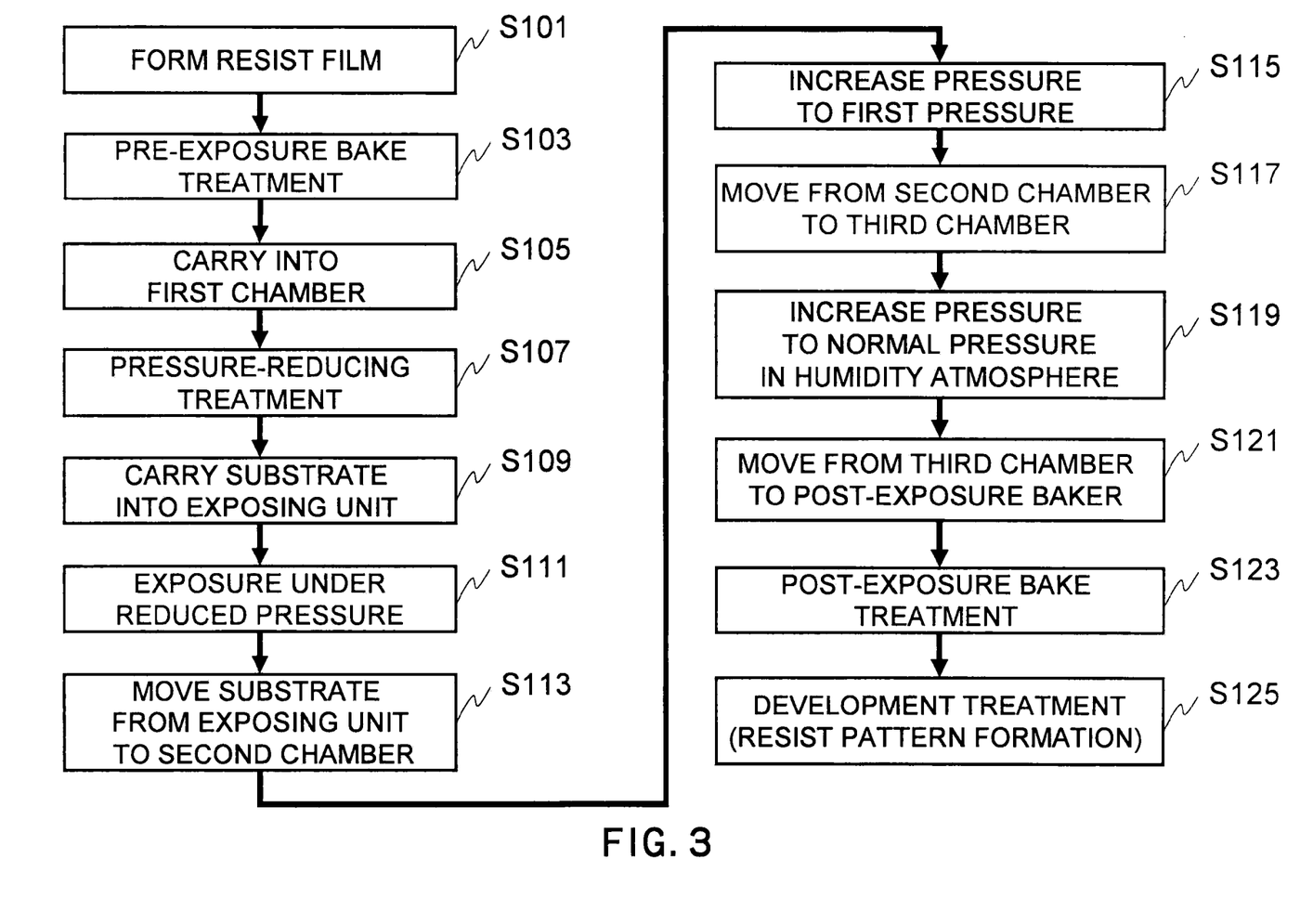
FIG. 3 is a diagram showing the process flow related to the first embodiment.

The process of resist pattern formation related to this embodiment will be described below in accordance with FIG. 3.

(1) First, a substrate obtained by forming at least one layer of hard mask material on a substrate to be processed is conveyed to the resist applying unit 101 and an acetal-based chemical amplification resist film is formed on the hard mask material (Step S101).

(2) Next, the substrate is conveyed to the resist baking unit 102, where pre-exposure bake treatment is performed (Step S103). The treatment temperature "Tpre" of this pre-exposure bake treatment is Ta<Tpre<Ta+80. In this expression, "Ta" is the temperature [° C.] of the substrate during exposure. More preferably, this temperature is Ta<Tpre<Ta+10. The bake time is not less than 10 seconds but not more than 120 seconds. Incidentally, this pre-exposure bake treatment may sometimes be omitted.

(3) Next, the substrate is carried into the first chamber 201 in order to perform EUV exposure (Step S105).

(4) Next, the vacuuming (pressure-reducing treatment) of the first chamber 201 is started (Step S107).

(5) Next, when the pressure of the first chamber 201 reaches a specified value of the EUV exposing system 200, the substrate is carried into the EUV exposing unit 202 (Step S109).

(6) Next, in the EUV exposing unit 202, EUV exposure is performed in a pressure-reduced condition (Step S111). As a result of this, a desired pattern is exposed on the resist film.

(7) Next, the substrate is moved from the EUV exposing unit 202 to the second chamber 203 (Step S113). Incidentally, before the substrate is moved, the second chamber 203 has been vacuumed to a pressure substantially equal to the pressure of the EUV exposing unit 202.

Figure 4:
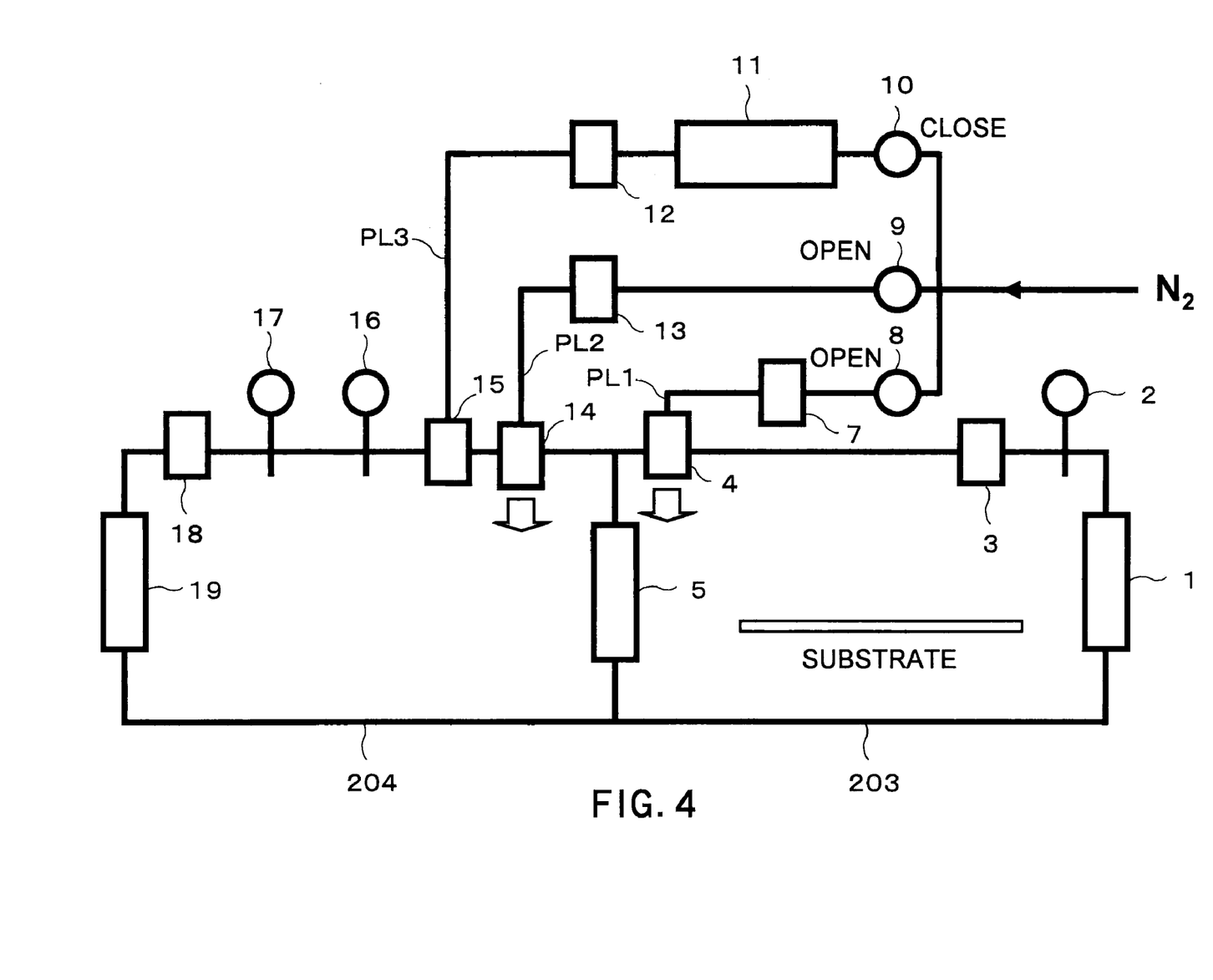
FIG. 4 is a schematic control diagram of the second chamber and the third chamber.

(8) Next, the pressure of the second chamber 203 is increased from the pressure of the EUV exposing unit 202 to a first pressure higher than the pressure of the EUV exposing unit 202 (Step S115). The first pressure is between $10^{-1}$ Pa and $10^{-4}$ Pa. The method of increasing the pressure is described in further detail by using FIG. 4. FIG. 4 is a schematic control diagram of the second chamber 203 and the third chamber 204. As shown in this figure, the on-off valves 8 and 9 are open. Then, to ensure that the pressures of the second chamber 203 and third chamber 204 become equal to the first pressure, the mass flow controllers 7, 13 introduce nitrogen gas while referring to measured values of the vacuum gauges 2, 17, respectively. Then, the injection of nitrogen gas is stopped when the pressures of the second chamber 203 and the third chamber 204 become substantially equal to the first pressure.

(9) Next, the gate valve 5 is opened and the substrate is moved from the second chamber 203 to the third chamber 204 (Step S117).

(10) Next, after the gate valve 5 is closed, nitrogen gas is introduced from the purging ports 14 and 15 of the third chamber 204, whereby the reduced-pressure releasing step of increasing the pressure of the third chamber 204 to a normal pressure (Step S119). The time required for an increase to a normal pressure is on the order of 1 to 2 minutes. Incidentally, during this duration, the vacuuming of the second chamber 203 is performed in order to receive the next substrate.

Figure 5:
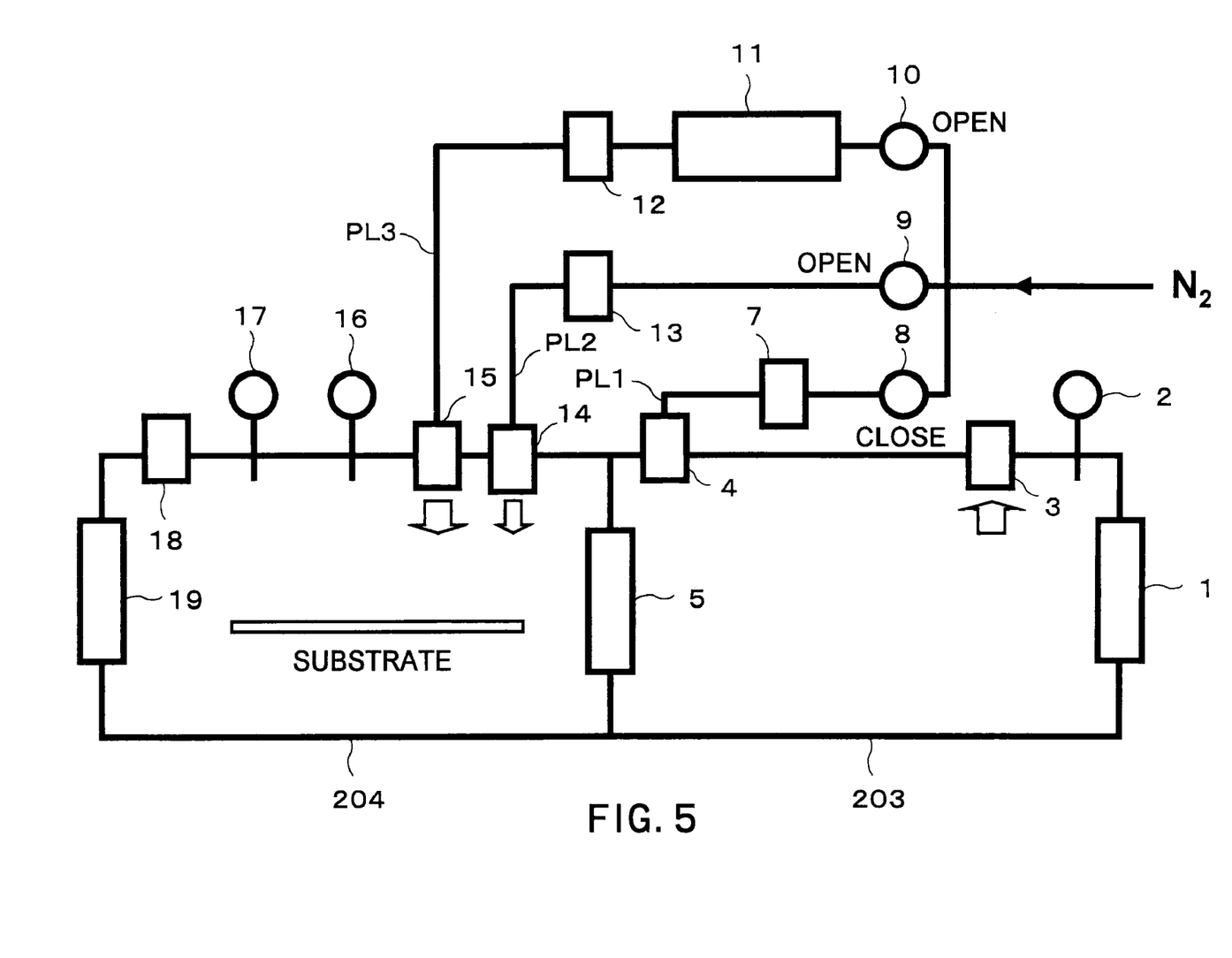
FIG. 5 is a schematic control diagram of the second chamber and the third chamber.

This reduced-pressure releasing step is described in further detail by using the schematic control diagram of FIG. 5. While the introduced volumes are being fine adjusted by use of the mass flow controllers 12, 13, nitrogen gas whose humidity is adjusted to a prescribed standard pressure-converted relative humidity and nitrogen gas not containing humidity are introduced from the purging port 15 and the purging port 14, respectively, at a prescribed ratio. As a result of this, while the standard pressure-converted relative humidity in the third chamber 204 is kept at not less than 10% but not more than 70%, the inner pressure of the third chamber 204 is increased to a normal pressure. In this connection, the standard pressure-converted relative humidity is preferably kept at not less than 30% but not more than 60%, particularly preferably at 45%. When the standard pressure-converted relative humidity is kept at 45%, nitrogen gas whose standard pressure-converted relative humidity is 60% and nitrogen gas not containing humidity are introduced from the purging ports 15 and 14, respectively, at a ratio of 1:0.33.

During the above-described reduced-pressure releasing step, an appropriate moisture is uniformly taken into the resist film. Thanks to this appropriate moisture, it is possible to cause an acid-catalysis reaction to occur in the post-exposure bake step to such an extent that a sufficient sensitivity is obtained and that does not deteriorate resolution.

(11) Next, after it is ascertained that the pressure of the third chamber 204 is a normal pressure and that the relative humidity has become a desired value (for example, 45%), the injection of nitrogen gas into the third chamber 204 is stopped. Then, the gate valve 19 of the third chamber 204 is opened and the substrate is moved from the third chamber 204 to the post-exposure baker 205 (Step S121). Incidentally, after the movement of the substrate, the gate valve 19 is closed and the vacuuming of the third chamber 204 is performed, whereby preparations for the treatment of the next substrate are made.

(12) Next, the bake treatment that heats the resist film is performed in the post-exposure baker 205 (Step S123). This bake treatment causes an acid-catalysis reaction to occur. The temperature of bake treatment is not less than room temperature but not more than 150° C., preferably not more than 130° C., and the bake time is not less than 30 seconds but not more than 120 seconds. Resolution is optimized by performing the bake treatment under these conditions. That is, it is possible to substantially increase resist sensitivity while keeping an image quality degradation within an allowable range. Incidentally, nitrogen gas containing moisture may also be used as the atmosphere of this bake treatment.

(13) Next, the substrate is moved from the post-exposure baker 205 to the developing unit 103, the development of the resist film is performed in the developing unit 103, and an exposed area or a non-exposed area is selectively removed, whereby a resist pattern is formed (Step S125).

A forming process of a resist pattern related to this embodiment was described above. A resist pattern with a half pitch of 25 nm was obtained by the above-described process.

Incidentally, although an acetal-based chemical amplification resist was used in the above description, this embodiment is not limited to this but can be applied to all chemical amplification resists used in processes including exposure in a vacuum. Also for the type of exposure, this embodiment is not limited to EUV exposure but is also applicable to EB exposure in which as with EUV exposure, exposure is performed in a vacuum.

Although in the above description the rear chamber of the EUV exposing system 200 was composed of two chambers (the second chamber 203 and the third chamber 204), this rear chamber may also be composed of the third chamber 204 alone by omitting the second chamber 203.

Next, a description will be given of desirable humidity conditions in the reduced-pressure releasing step (Step S119) on the basis of results of an investigation into the relationship between relative humidity and the quality of formed resist patterns.

This relationship in various kinds of acetal-based chemical amplification resists was investigated. Results of the investigation are as follows.

When the standard pressure-converted relative humidity was less than 10%, the in-plane uniformity of pattern size was low although the sensitivity of resists was improved. Therefore, it became apparent that if humidity exists to some extent, then the use of a chemical amplification resist is effective in an improvement in sensitivity, whereas from the standpoint of uniformity, it is desirable that the standard pressure-converted relative humidity be not less than approximately 10%.

When the standard pressure-converted relative humidity was higher than 70%, the defect of watermarks was observed after post-exposure bake treatment. This is probably due to the phenomenon that excessive moisture was adsorbed on the resist surface and the adsorbed moisture formed watermarks.

Therefore, if the standard pressure-converted relative humidity in the third chamber 204 in the reduced-pressure releasing step is not less than 10% but not more than 70%, it is possible to meet the conditions that the in-plane uniformity of pattern size is good and that defects are few. This standard pressure-converted relative humidity is preferably not less than 30% but not more than 60%, under which conditions the in-plane uniformity was excellent and the number of defects was almost zero.

On the other hand, results of an investigation of chemical amplification resists other than acetal-based ones are as follows. Also for chemical amplification resists other than acetal-based ones (for example, acryl chemical amplification resists, coma chemical amplification resists), it is necessary that the standard pressure-converted relative humidity in the reduced-pressure releasing step be approximately not less than 10% but not more than 70%. This standard pressure-converted relative humidity is preferably not less than 30% but not more than 60%, under which conditions the in-plane uniformity was excellent and the number of defects was almost zero.

Incidentally, although in the above description nitrogen gas was used as the gas to be introduced into the chambers, inert gases (for example, Ar gas) other than nitrogen gas may also be used.

As described above, according to this embodiment, a chemical amplification resist is humidified uniformly in the plane and appropriately by performing the reduced-pressure releasing step while keeping the standard pressure-converted relative humidity in the chamber in the range of not less than 10% but not more than 70%. It is possible to form a resist pattern in which dimensional variations and defects are reduced as far as possible by performing thereafter bake treatment and development treatment. Furthermore, because humidification is performed in the reduced-pressure releasing step, it is unnecessary to singly provide a step of humidifying a resist and, therefore, it is possible to maintain a high throughput.

Second Embodiment

Next, a description will be given of a method of forming a resist pattern related to the second embodiment. One of the differences between this embodiment and the first embodiment is the type of the resist to be used as described above. A chemical amplification resist is used in the first embodiment, whereas a non-chemical amplification resist is used in the second embodiment.

The system to be used is the same as in the first embodiment, i.e., the resist applying/developing system 100 and the EUV exposing system 200, which are shown in FIG. 1.

Figure 6:
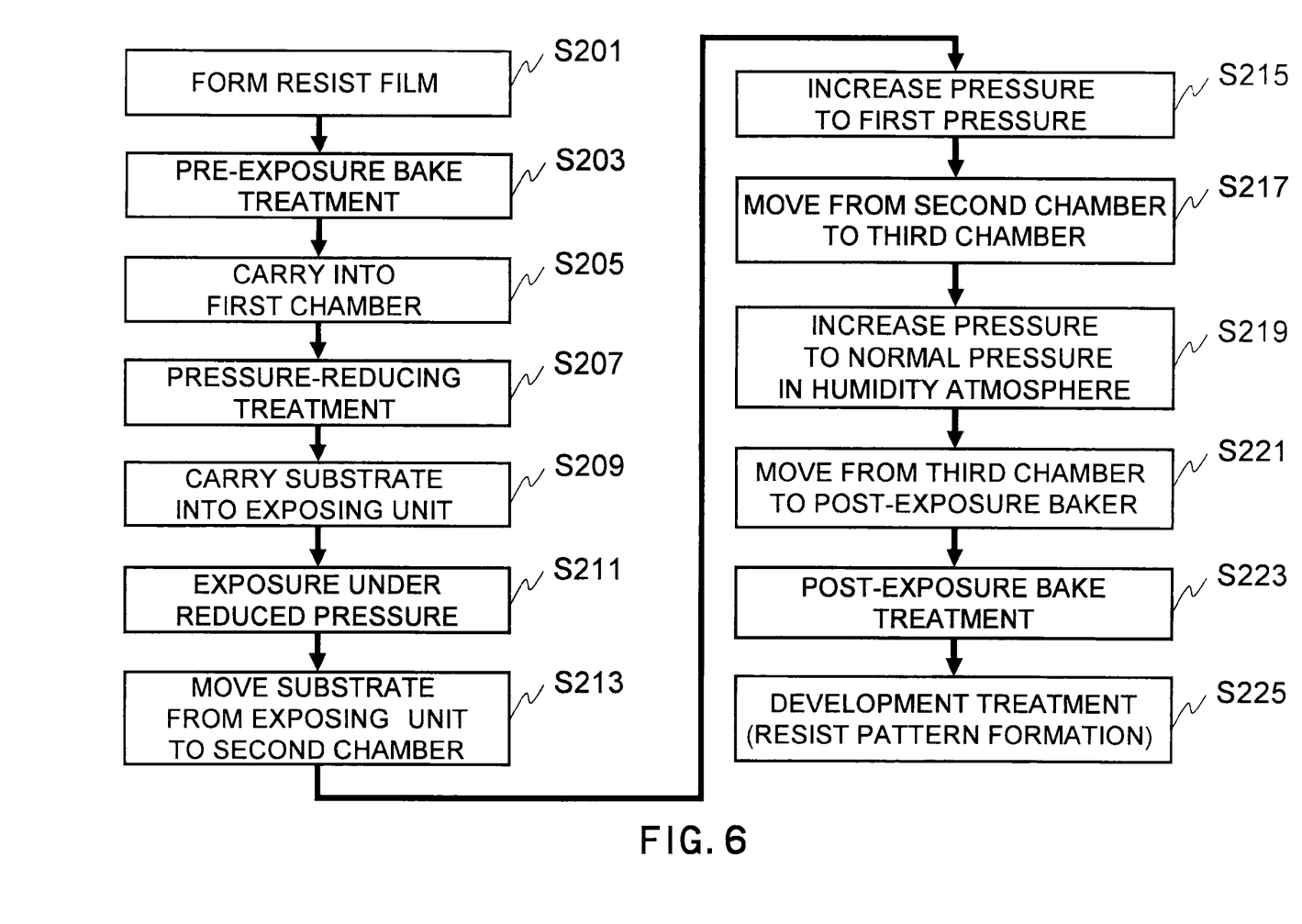
FIG. 6 is a diagram showing the process flow related to the second embodiment.

The process of resist pattern formation related to this embodiment will be described below in accordance with FIG. 6.

(1) First, a substrate obtained by forming at least one layer of hard mask material on a substrate to be processed is conveyed to the resist applying unit 101 and a non-chemical amplification low-molecular resist film is formed on the hard mask material (Step S201). For example, a polyphenol derivative-based low-molecular resist is used as this low-molecular resist.

(2) Next, the substrate is conveyed to the resist baking unit 102, where pre-exposure bake treatment is performed (Step S203). The treatment temperature "Tpre" of this pre-exposure bake treatment is Ta<Tpre<Ta+80. In this expression, "Ta" is the temperature [° C.] of the substrate during exposure. More preferably, this temperature is Ta<Tpre<Ta+10. The bake time is not less than 10 seconds but not more than 120 seconds. Incidentally, this pre-exposure bake treatment may sometimes be omitted.

(3) Next, the substrate is carried into the first chamber 201 in order to perform EUV exposure (Step S205).

(4) Next, the vacuuming (pressure-reducing treatment) of the first chamber 201 is started (Step S207).

(5) Next, when the pressure of the first chamber 201 reaches a specified value of the EUV exposing system 200, the substrate is carried into the EUV exposing unit 202 (Step S209).

(6) Next, in the EUV exposing unit 202, EUV exposure is performed in a pressure-reduced condition (Step S211). As a result of this, a desired pattern is exposed on the resist film.

(7) Next, the substrate is moved from the EUV exposing unit 202 to the second chamber 203 (Step S213). Incidentally, before the substrate is moved, the second chamber 203 has been vacuumed to a pressure substantially equal to the pressure of the EUV exposing unit 202.

(8) Next, the pressure of the second chamber 203 is increased from the pressure of the EUV exposing unit 202 to a first pressure higher than the pressure of the EUV exposing unit 202 (Step S215). The first pressure is between $10^{-1}$ Pa and $10^{-4}$ Pa. Details of the method of increasing the pressure are the same as in the first embodiment (Step S115).

(9) Next, the gate valve 5 is opened and the substrate is moved from the second chamber 203 to the third chamber 204 (Step S217).

(10) Next, after the gate valve 5 is closed, nitrogen gas is introduced from the purging ports 14 and 15 of the third chamber 204, whereby the reduced-pressure releasing step of increasing the pressure of the third chamber 204 to a normal pressure (Step S219). The time required for an increase to a normal pressure is on the order of 1 to 2 minutes. Incidentally, during this duration, the vacuuming of the second chamber 203 is performed in order to receive the next substrate.

In this reduced-pressure releasing step, in the same manner as with the first embodiment, while the introduced volumes are being fine adjusted by use of the mass flow controllers 12, 13, nitrogen gas whose humidity is adjusted to a prescribed standard pressure-converted relative humidity and nitrogen gas not containing humidity are introduced from the purging port 15 and the purging port 14, respectively, at a prescribed ratio. As a result of this, while the standard pressure-converted relative humidity in the third chamber 204 is kept at not less than 20% but not more than 70%, the inner pressure of the third chamber 204 is increased to a normal pressure. In this connection, the standard pressure-converted relative humidity is kept preferably at not less than 40% but not more than 60%, particularly preferably at 50%. When the standard pressure-converted relative humidity is kept at 50%, nitrogen gas whose standard pressure-converted relative humidity is 60% and nitrogen gas not containing humidity are introduced from the purging ports 15 and 14, respectively, at a ratio of 1:0.2.

During the above-described reduced-pressure releasing step, moisture necessary for smoothing a difference in the photosensitive rate generated by a standing wave during the post-exposure bake step is taken into a resist film.

(11) Next, after it is ascertained that the pressure of the third chamber 204 is a normal pressure and that the relative humidity has become a desired value (for example, 50%), the injection of nitrogen gas into the third chamber 204 is stopped.

Then, the gate valve 19 of the third chamber 204 is opened and the substrate is moved from the third chamber 204 to the post-exposure baker 205 (Step S221). Incidentally, after the movement of the substrate, the gate valve 19 is closed and the vacuuming of the third chamber 204 is performed, whereby preparations for the treatment of the next substrate are made.
(12) Next, the bake treatment that heats the resist film is performed in the post-exposure baker 205 (Step S223). The temperature of bake treatment is not less than 80° C. but not more than 150° C., preferably not more than 130° C., and the bake time is not less than 30 seconds but not more than 120 seconds. Incidentally, nitrogen gas containing moisture may also be used as the atmosphere of this bake treatment.
(13) Next, the substrate is moved from the post-exposure baker 205 to the developing unit 103, the development of the resist film is performed in the developing unit 103, and an exposed area or a non-exposed area is selectively removed, whereby a resist pattern is formed (Step S225).

A forming process of a resist pattern related to this embodiment was described above. A resist pattern with a half pitch of 20 nm was obtained by the above-described process. When after EUV exposure the pressure was increased to a normal pressure by using nitrogen gas not containing humidity as conventionally, the line edge roughness (LER) was about 2.5 nm. However, in the case of the method of this embodiment, LER was capable of being improved to 2.0 nm.

Incidentally, although a polyphenol derivative-based non-chemical amplification resist was used in the above description, this embodiment is not limited to this but can be applied to resists using various base molecules having the benzene skeleton, and it has been ascertained that equivalent performance is obtained. This embodiment is not limited to low-molecular resists but is applicable also to resin-based non-chemical amplification resist (for example, polymethylmethacrylate), and it has been ascertained that equivalent performance is obtained. Also for the type of exposure, this embodiment is not limited to EUV exposure but is also applicable to EB exposure in which as with EUV exposure, exposure is performed in a vacuum.

Although in the above description the rear chamber of the EUV exposing system 200 was composed of two chambers (the second chamber 203 and the third chamber 204), this rear chamber may also be composed of the third chamber 204 alone by omitting the second chamber 203.

Next, a description will be given of desirable humidity conditions in the reduced-pressure releasing step (Step S219) on the basis of results of an investigation into the relationship between relative humidity and the quality of formed resist patterns. This relationship in various kinds of low-molecular or high-molecular non-chemical amplification resists was investigated. Results of the investigation are as follows.

When the standard pressure-converted relative humidity was less than 20%, in-plane dimensional variations were great although an improvement in the line edge roughness was observed. Therefore, it became apparent that it is desirable that from the standpoints of the improvement of LER and uniformity, the standard pressure-converted relative humidity be not less than approximately 20%.

When the standard pressure-converted relative humidity was higher than 70%, the defect of watermarks was observed after post-exposure bake treatment. This is probably due to the phenomenon that excessive moisture was adsorbed on the resist surface and the adsorbed moisture formed watermarks.

Therefore, if the standard pressure-converted relative humidity in the third chamber 204 in the reduced-pressure releasing step is not less than 20% but not more than 70%, it is possible to meet the conditions that LER is improved, the in-plane uniformity is good and that defects are few. This standard pressure-converted relative humidity is preferably not less than 40% but not more than 60%, under which conditions LER and the in-plane uniformity were excellent and the number of defects was almost zero.

Incidentally, although in the above description nitrogen gas was used as the gas to be introduced into the chambers, inert gases (for example, Ar gas) other than nitrogen gas may also be used.

As described above, according to this embodiment, a non-chemical amplification resist is humidified uniformly in the plane and appropriately by performing the reduced-pressure releasing step while keeping the standard pressure-converted relative humidity in the chamber in the range of not less than 20% but not more than 70%. It is possible to form a resist pattern in which dimensional variations and defects are reduced as far as possible by performing thereafter bake treatment and development treatment. Furthermore, the line edge roughness can be reduced. Because humidification is performed in the reduced-pressure releasing step, it is unnecessary to singly provide a step of humidifying a resist and, therefore, it is possible to maintain a high throughput.

Third Embodiment

Figure 7:
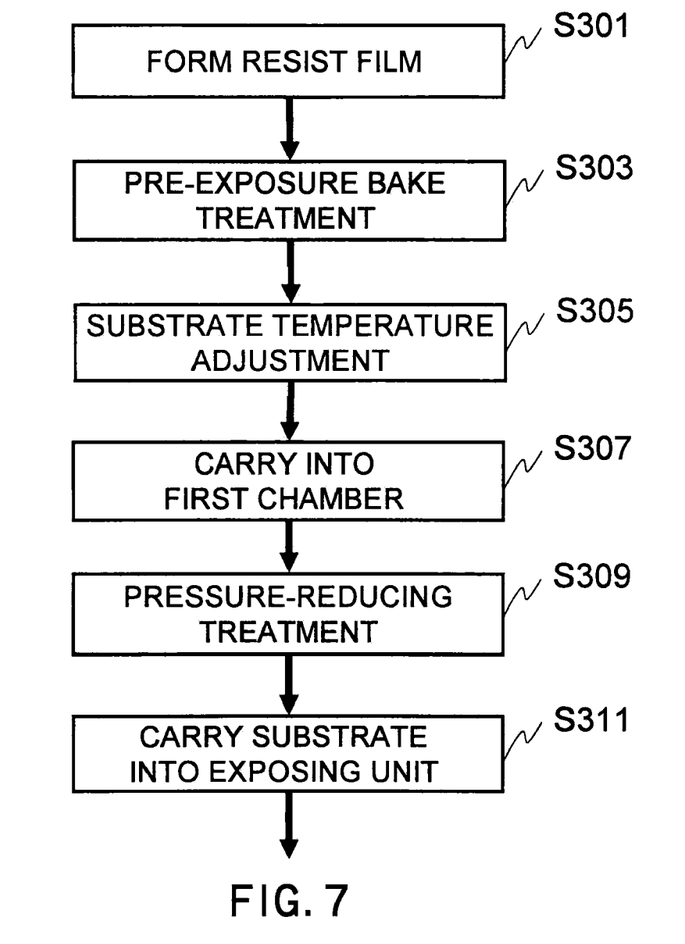
FIG. 7 is a diagram showing the process flow related to the third embodiment.

Next, a description will be given of a method of forming a resist pattern related to the third embodiment. In this embodiment, an improvement in throughput is achieved by making the heating step after the pressure-reducing treatment unnecessary by adjusting the substrate temperature before the substrate is carried into the first chamber 201.

The system to be used is the same as in the first and second embodiments, i.e., the resist applying/developing system 100 and the EUV exposing system 200, which are shown in FIG. 1.

Figure 8:
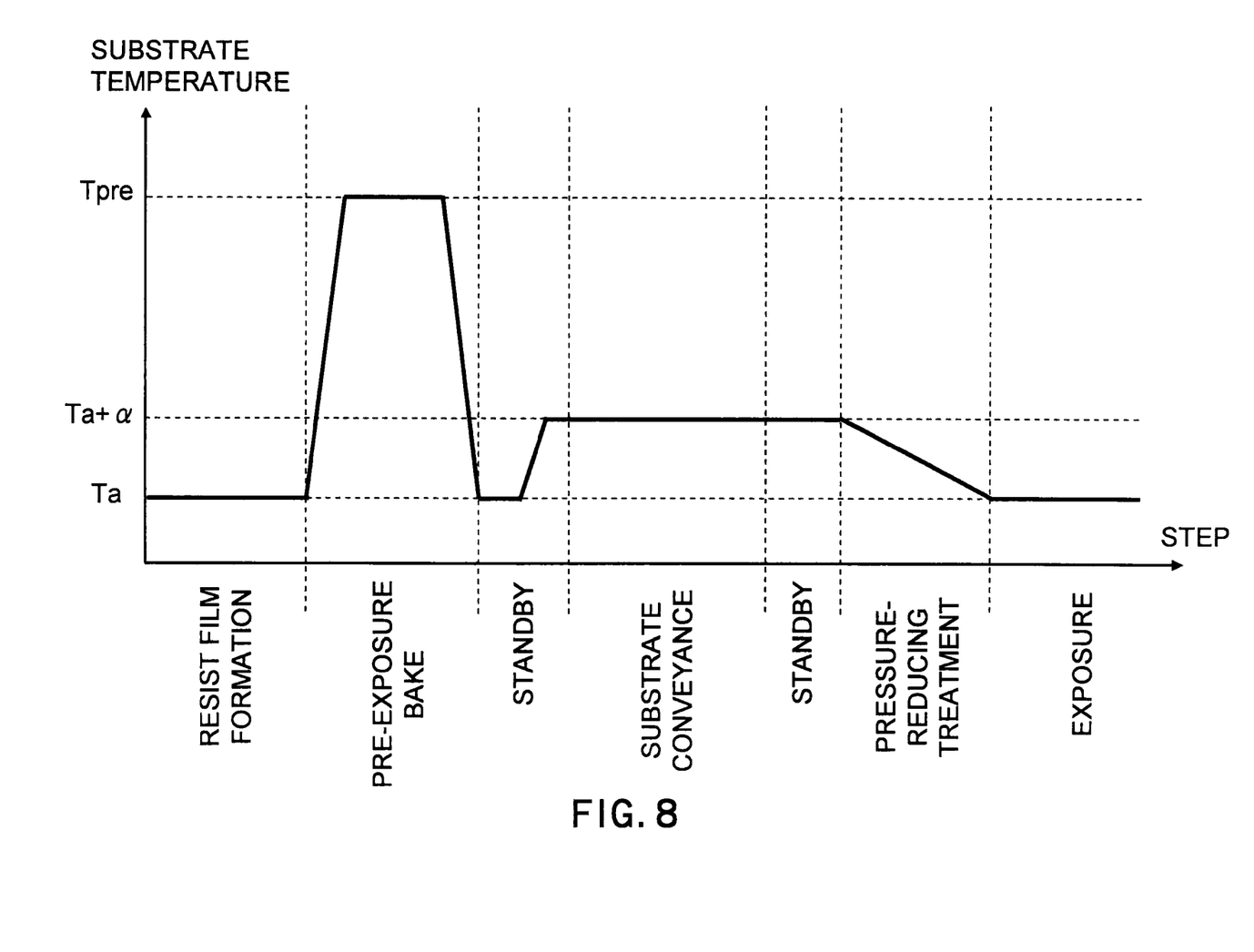
FIG. 8 is a diagram showing an example of the relationship between the steps related to the third embodiment and substrate temperature.
Figure 9:
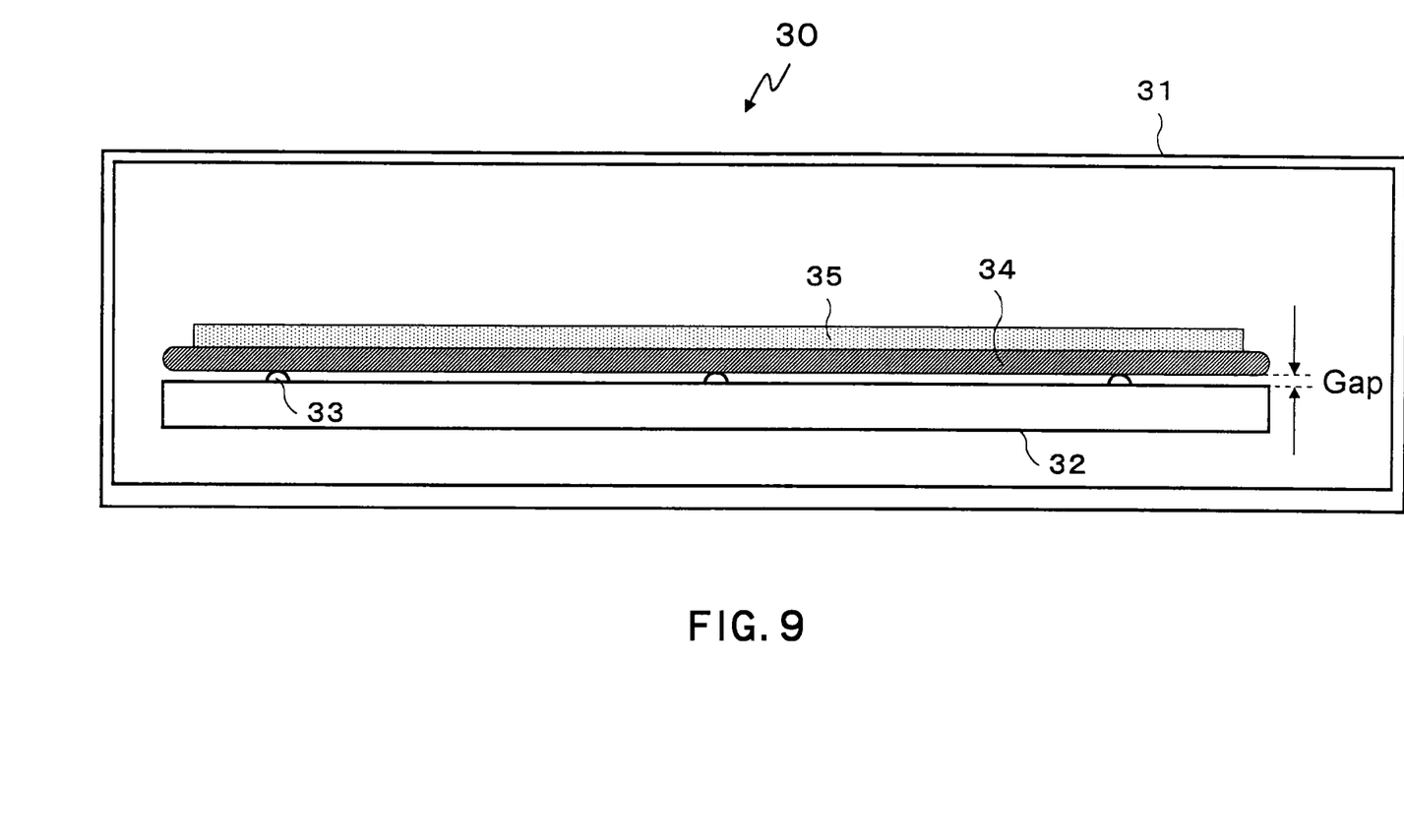
FIG. 9 is a diagram to explain the structure of a temperature adjusting device.

The process of resist pattern formation related to this embodiment will be described below with the aid of FIGS. 7 and 8. FIG. 7 shows the process flow related to this embodiment, and FIG. 8 shows an example of the relationship between the steps and the substrate temperature.
(1) First, a substrate obtained by forming at least one layer of hard mask material on a substrate to be processed is conveyed to the resist applying unit 101 and a resist film is formed on the hard mask material (Step S301).
(2) Next, the substrate is conveyed to the resist baking unit 102, where pre-exposure bake treatment is performed (Step S303). At this time, the substrate temperature is increased from "Ta" [° C.], which is the substrate temperature during exposure, (for example, 23° C. of room temperature) to "Tpre" [° C.]. The expression Ta<Tpre<Ta+80 holds. More preferably, Ta<Tpre<Ta+10. The bake time is not less than 10 seconds but not more than 120 seconds. The substrate temperature before bake treatment is not limited to "Ta." Incidentally, this pre-exposure bake treatment may sometimes be omitted.
(3) Next, after the finish of the pre-exposure bake treatment, the adjustment of the substrate temperature is performed by using a temperature adjusting device 30 (Step S305). This temperature adjusting device 30 is provided in each interface area of the resist applying/developing system 100 and of the EUV exposing system 200, and in a conveying device that conveys the substrate from the resist applying/developing system 100 to the EUV exposing system 200. The structure of this temperature adjusting device 30 is described. As shown in FIG. 9, this temperature adjusting device 30 is provided with a chamber 31 and a hot plate 32 having gap pins 33. A substrate 34 to which a resist 35 is applied is placed on this hot plate 32. Because the substrate 34 is supported by the gap pins 33 alone, the adherence of dust and the like to the back surface of the substrate is prevented. The gap between the substrate 34 and the hot plate is approximately 100 μm to 200 μm. The substrate temperature is adjusted in an atmosphere of dry air or a dry inert gas (for example, nitrogen gas). As shown in FIG. 8, the substrate temperature is adjusted to "Ta+α." For example, α=5° C. "α" is a value that is experimentally or theoretically determined beforehand so that after the vacuuming step in the first chamber 201, which will be described later, the substrate temperature becomes "Ta," which is the temperature during exposure. Because the temperature of the substrate is adjusted by the convection of the gas in the chamber 31, the time required for temperature adjustment is shortened compared to the case of temperature adjustment in a vacuum by radiation. As is apparent from FIG. 8, the substrate temperature is adjusted to "Ta+α" in the interface area of the resist applying/developing system 100 and is held to this temperature in the conveying device and the interface area of the EUV exposing system 200.

(4) Next, the substrate is carried into the first chamber 201 (Step S307).

(5) Next, vacuuming (pressure-reducing treatment) is performed until the pressure of the first chamber 201 reaches a specified value (Step S309). The substrate temperature decreases as a result of this pressure-reducing treatment. Then, as shown in FIG. 8, at a point in time when the pressure-reducing treatment has been completed, the temperature of the substrate becomes a prescribed temperature "Ta" during exposure.

(6) Next, the substrate is carried into the EUV exposing unit 202 (Step S311). The description of the succeeding steps is omitted because these steps are the same as Step S111 to Step S125 of the first embodiment, Step S211 to Step S225 of the second embodiment, or the exposure and development steps that are usually performed.

Incidentally, although in the above description the adjustment of the substrate temperature was performed in the interface area of the resist applying/developing system 100 and was performed by holding the temperature adjusted in the conveying device and the interface area of the EUV exposing system 200 (see FIG. 8), the adjustment method is not limited to this. The adjustment of the substrate temperature may be performed, for example, in the conveying device alone or in the interface area alone. That is, any combination of the temperature adjusting device 30 to be used is allowed. Also, the temperature adjustment may be performed so as to cover a plurality of temperature adjusting devices.

In FIG. 8, after the finish of the pre-exposure bake, the substrate temperature is reduced to "Ta" and then increased to "Ta+α." However, it is also possible to adopt a method that involves ensuring that the substrate temperature at a point in time when the pre-exposure bake has been finished becomes "Ta+α" and keeping the temperature by use of the temperature adjusting device 30.

The above-described method is not limited to EUV exposure but is applicable to exposure performed in a vacuum, such as EB exposure.

As described above, according to this embodiment, by use of the temperature adjusting device 30 provided in the interface area and/or the conveying device, the substrate temperature is adjusted before the substrate is carried into the first chamber 201 so that the substrate temperature after pressure-reducing treatment becomes "Ta" [° C.], which is the substrate temperature during exposure. As a result of this, the step of increasing the substrate temperature after pressure-reducing treatment becomes unnecessary. Furthermore, because the temperature adjustment of the substrate is performed during the standby time in the interface area and the conveyance time in the conveying device, it is possible to improve the throughput of the resist pattern forming process including the step of performing exposure in a vacuum. More specifically, 10 seconds to 20 seconds per wafer are shortened compared to a case where the substrate temperature is increased after vacuuming. A substantial improvement in throughput is possible in consideration of the fact that the throughput during mass production is not less than approximately 100 WPH (wafers per hour). Furthermore, because a temperature adjusting device provided in existing equipment is used, this embodiment has the advantage that conventional steps are little affected by the use of the temperature adjusting device.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concept as defined by the appended claims and their equivalents.

The invention claimed is:

1. A method of forming a resist pattern, comprising:
   forming a resist film on a substrate;
   subjecting the resist film to exposure treatment in a pressure-reduced condition by using soft X-rays as an exposure source after performing pressure-reducing treatment;
   performing reduced-pressure releasing treatment that releases the resist film from a pressure-reduced condition while humidifying the resist film by introducing a humidity-adjusted gas into the pressure-reduced environment;
   performing bake treatment that heats the resist film after the reduced-pressure releasing treatment; and
   developing the resist film.

2. The method of forming a resist pattern according to claim 1, wherein the resist film is a chemical amplification resist film, and
   wherein the standard pressure-converted relative humidity of an atmosphere in the reduced-pressure releasing treatment is kept at not less than 10% but not more than 70%.

3. The method of forming a resist pattern according to claim 2, wherein the bake treatment is performed by heating the resist film for a duration of not less than 30 seconds but not more than 120 seconds to temperatures of not less than room temperature but not more than 150° C.

4. The method of forming a resist pattern according to claim 3, wherein before the reduced-pressure releasing treatment is performed after the formation of the resist film, the resist film is heated for a duration of not less than 10 seconds but not more than 120 seconds to a temperature that is higher than an exposure substrate temperature, which is the temperature of the substrate in the exposure treatment, and is lower than a temperature obtained by adding 80° C. to the exposed substrate temperature.

5. The method of forming a resist pattern according to claim 1, wherein the resist film is a non-chemical amplification resist film, and wherein the standard pressure-converted relative humidity of an atmosphere in the reduced-pressure releasing treatment is kept at not less than 20% but not more than 70%.

6. The method of forming a resist pattern according to claim 5, wherein the bake treatment is performed by heating the resist film for a duration of not less than 30 seconds but not more than 120 seconds to temperatures of not less than 80° C. but not more than 150° C.

7. The method of forming a resist pattern according to claim 6, wherein before the pressure-reducing treatment is performed after the formation of the resist film, the resist film is heated for a duration of not less than 10 seconds but not more than 120 seconds to a temperature that is higher than an exposure substrate temperature, which is the temperature of the substrate in the exposure treatment, and is lower than a temperature obtained by adding 80° C. to the exposure substrate temperature.

8. The method of forming a resist pattern according to claim 1, wherein by use of a temperature adjusting device, the temperature of the substrate is adjusted to an adjusted substrate temperature higher than an exposure substrate temperature, which is the temperature of the substrate during the exposure treatment, thereafter the temperature of the substrate is changed to the exposure substrate temperature by performing the pressure-reducing treatment, and the exposure treatment of the substrate having the exposure substrate temperature is performed.

9. The method of forming a resist pattern according to claim 8, wherein adjustment of the temperature of the substrate is performed in the atmosphere of air or an inert gas.

10. A method of forming a resist pattern, comprising:
forming a resist film on a substrate;
carrying the substrate into a first chamber;
performing pressure-reducing treatment that reduces the pressure of the first chamber to a prescribed pressure;
carrying the substrate into an exposure chamber in a pressure-reduced condition;
performing exposure treatment that exposes a prescribed pattern on the resist film by using soft X-rays as an exposure source;
moving the substrate from the exposure chamber to a second chamber whose pressure is substantially equal to the pressure of the exposure chamber;
performing reduced-pressure releasing treatment that increases the pressure of the second chamber to a normal pressure while humidifying the resist film by introducing a humidity-adjusted gas into the second chamber;
performing bake treatment that heats the substrate after the reduced-pressure releasing treatment; and
developing the resist film.

11. The method of forming a resist pattern according to claim 10, wherein the resist film is a chemical amplification resist film and
wherein the standard pressure-converted relative humidity in the second chamber in the reduced-pressure releasing treatment is not less than 10% but not more than 70%.

12. The method of forming a resist pattern according to claim 11, wherein the bake treatment is performed by heating the resist film for a duration of not less than 30 seconds but not more than 120 seconds to temperatures of not less than room temperature but not more than 150° C.

13. The method of forming a resist pattern according to claim 10, wherein the resist film is a non-chemical amplification resist film and
wherein the standard pressure-converted relative humidity in the second chamber in the reduced-pressure releasing treatment is not less than 20% but not more than 70%.

14. The method of forming a resist pattern according to claim 13, wherein the bake treatment is performed by heating the resist film for a duration of not less than 30 seconds but not more than 120 seconds to temperatures of not less than 80° C. but not more than 150° C.

15. The method of forming a resist pattern according to claim 10, wherein by use of a temperature adjusting device, the temperature of the substrate is adjusted to an adjusted substrate temperature higher than an exposure substrate temperature, which is the temperature of the substrate during the exposure treatment, thereafter the temperature of the substrate is changed to the exposure substrate temperature by performing the pressure-reducing treatment, and the exposure treatment of the substrate having the exposure substrate temperature is performed.

16. A method of forming a resist pattern, comprising:
forming a resist film on a substrate;
carrying the substrate into a first chamber;
performing pressure-reducing treatment that reduces the pressure of the first chamber to a prescribed pressure;
carrying the substrate into an exposure chamber in a pressure-reduced condition;
performing exposure treatment that exposes a prescribed pattern on the resist film by using soft X-rays as an exposure source;
moving the substrate from the exposure chamber to a second chamber whose pressure is substantially equal to the pressure of the exposure chamber;
increasing the pressure of the second chamber to a pressure higher than the pressure of the exposure chamber by introducing a gas into the second chamber;
moving the substrate from the second chamber to a third chamber whose pressure is substantially equal to the pressure of the second chamber;
performing reduced-pressure releasing treatment that increases the pressure of the third chamber to a normal pressure while humidifying the resist film by introducing a humidity-adjusted gas into the third chamber;
performing bake treatment that heats the substrate after the reduced-pressure releasing treatment; and
developing the resist film.

17. The method of forming a resist pattern according to claim 16, wherein the resist film is a chemical amplification resist film and
wherein the standard pressure-converted relative humidity in the second chamber in the reduced-pressure releasing treatment is not less than 10% but not more than 70%.

18. The method of forming a resist pattern according to claim 16, wherein the resist film is a non-chemical amplification resist film and
wherein the standard pressure-converted relative humidity in the second chamber in the reduced-pressure releasing treatment is not less than 20% but not more than 70%.

* * * * *